United States Patent
Huebner

(10) Patent No.: US 7,449,903 B2
(45) Date of Patent: Nov. 11, 2008

(54) METHOD AND SYSTEM FOR THE OPTICAL INSPECTION OF CONTACT FACES AT SEMICONDUCTOR DEVICES WITH DIFFERENT APPEARANCES

(75) Inventor: Michael Huebner, Schonau (DE)

(73) Assignee: Infineon Technologies AG, Munich (DE)

( * ) Notice: Subject to any disclaimer, the term of this patent is extended or adjusted under 35 U.S.C. 154(b) by 247 days.

(21) Appl. No.: 11/399,228

(22) Filed: Apr. 6, 2006

(65) Prior Publication Data
US 2007/0236234 A1      Oct. 11, 2007

(30) Foreign Application Priority Data
Apr. 6, 2005    (DE)    ............ 10 2005 015 826

(51) Int. Cl.
*G01R 31/02* (2006.01)
(52) U.S. Cl. ............... 324/757; 324/756; 324/758
(58) Field of Classification Search ............. None
See application file for complete search history.

(56) References Cited

U.S. PATENT DOCUMENTS

| | | | | |
|---|---|---|---|---|
| 4,786,867 | A * | 11/1988 | Yamatsu | 324/758 |
| 5,394,100 | A * | 2/1995 | Bohler et al. | 324/758 |
| 6,784,678 | B2 * | 8/2004 | Pietzschmann | 324/758 |

* cited by examiner

*Primary Examiner*—Minh N Tang
(74) *Attorney, Agent, or Firm*—Dicke, Billig & Czaja, PLLC

(57) ABSTRACT

A system and method is provided that reliably determines the position of contact needle tips on a contact pad irrespective of the contact pad geometry and the character of the contact pad surface. For example, optical recognition of the surface of the contact pad is completed prior to contacting the contact pad by the contact element and generating a reference image. Optical recognition of the surface of the contact pad is completed after contacting of the contact pad by the contact element when generating the image to be analyzed. A difference between the reference image and the image to be analyzed is taken, and the resulting image is analyzed for recognized contrasts or impressions left by the contact element on the contact pad.

22 Claims, 2 Drawing Sheets

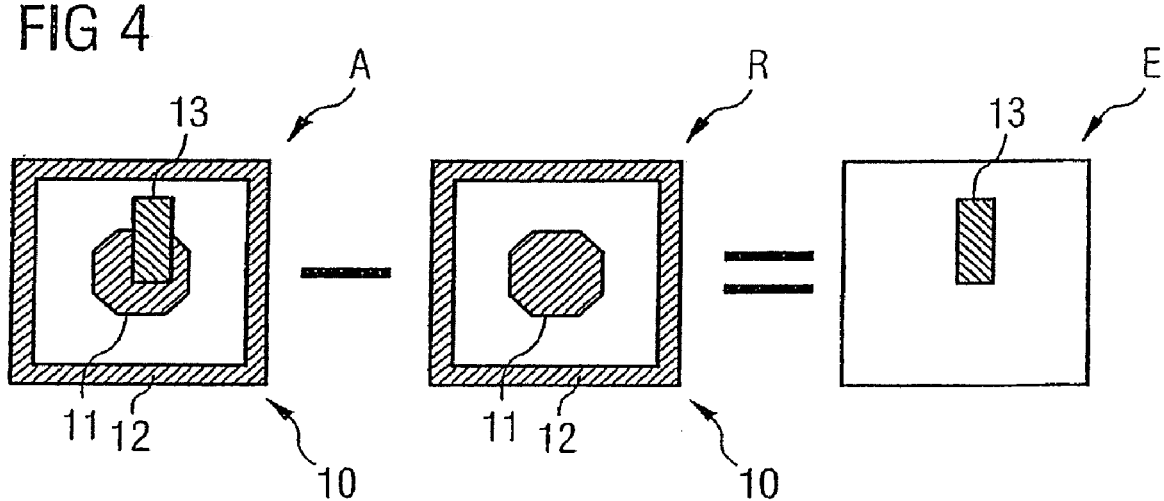

METHOD AND SYSTEM FOR THE OPTICAL INSPECTION OF CONTACT FACES AT SEMICONDUCTOR DEVICES WITH DIFFERENT APPEARANCES

CROSS-REFERENCE TO RELATED APPLICATIONS

This Utility Patent Application claims priority to German Patent Application No. DE 10 2005 015 826.9, filed on Apr. 6, 2005, which is incorporated herein by reference.

FIELD OF THE INVENTION

The present invention relates to a method and to a system for the optical inspection of contact faces or so-called contact pads at semiconductor devices, and in particular to a method for the optical inspection of contact pads in semiconductor devices with different appearances. The contact pads serve to electrically contact the semiconductor device with the periphery via so-called bonding wires connecting the contact pads with connection pins or contact balls.

BACKGROUND

As a rule, a major number of semiconductor devices are manufactured simultaneously on monocrystalline silicon discs, so-called wafers. In so doing, the circuits of the semiconductor devices are usually structured on the wafer in a plurality of process steps. The semiconductor devices are individualized by the wafer being sawn, and are housed in plastics material. Frequently, the semiconductor devices are examined by appropriate test systems or test stations for their operability even prior to the individualization.

Thus, the semiconductor devices, such as integrated computing circuits, semiconductor memory devices, e.g., functional memory devices and table memory devices, etc., can be subjected to extensive tests at a plurality of test stations in the semi-finished and/or in the finished state. For testing the semiconductor devices, an appropriate test device may be provided at the respective test station, the test device generating the test signals required for the testing of the semiconductor devices.

The present invention especially serves to be used during the testing of the operability of semiconductor devices with appropriate test systems or test devices. To electrically connect the semiconductor device to be tested in a test station with the test system, a specific contact device, a semiconductor device test card a so-called "probe card" is commonly used. At the semiconductor device test card there are provided needle-shaped pins contacting the corresponding contact pads of the semiconductor devices to be tested.

By means of the probe card, at a test station, the signals required for testing semiconductor devices that are still positioned on the wafer can be generated by the test device that is connected with the probe card and can be introduced into the respective contact pads of the semiconductor devices by means of the contact needles provided at the probe card. The signals output by the semiconductor device at corresponding contact pads in reaction to the test signals input are in turn tapped by needle-shaped pins of the probe card and are, for instance, transmitted to the test device by a signal line connecting the probe card with the test device, where an evaluation of the corresponding signals may take place. After the sawing apart of the wafer or the individualizing of the semiconductor devices positioned on the wafer, respectively, these may then be loaded in a corresponding outer package, so-called carriers, and be transported to further test stations.

At a further test station, the carriers with the semiconductor devices to be tested may be inserted into corresponding adapters or sockets that are connected with a test device, and subsequently the semiconductor device positioned in the carrier may be subject to further test methods. For testing the semiconductor devices positioned in the carriers, the test signals output by the test device are transmitted, via an adapter and corresponding pins of the carrier, to the contact pads of the semiconductor device to be tested. The signals output by the semiconductor devices at the corresponding contact pads in reaction to the test signals input are tapped by the carrier pins and transmitted to the test device via the adapter (and a signal line connecting the adapter with the test device), where an evaluation of the signals may take place.

To achieve, with the test methods, a high accuracy of the signals introduced into the semiconductor device to be tested or of the signals measured, respectively, the respective test device has to be subject to a calibration or set-up process prior to the actual test method. To this end, the respective test device may, via a signal line, output a corresponding calibration signal to a probe card contacting the semiconductor device to be tested or the carrier carrying the semiconductor device, respectively. Subsequently, the test device may measure and evaluate the reflection signal caused by the calibration signal.

A further condition for the exact performance of a test method is the reliable contacting of the semiconductor device to be tested with the test system or with the test device, respectively. To this end, a good electrical connection between the contact needles of the test system and the contact pads of the semiconductor device to be tested has to be guaranteed.

At the beginning of the process for testing the operability of the semiconductor device, the contact needles or the probe card of the test device, respectively, are/is usually positioned above the semiconductor device to be tested such that the respectively desired pins or contact needles of the test device each contact the desired connections or contact pads of the semiconductor device to be tested.

After the testing of the semiconductor devices at wafer level, the impressions left by the contact needles on the contact pads of the chips are examined with respect to size and position. This is necessary to supervise the process of probing and to correct deviations in the position of the contact needles vis-à-vis the contact pads. If the impression of the contact needles exceeds the edge of the contact pad, no electrical connection between the contact needle and the contact pad has been established, and damage of the passivation surrounding the contact pad may occur, which constitutes a potential risk of reliability during later use.

Due to manufacturing tolerances and deviations in the position of the semiconductor devices to be tested on the wafer or in the carriers, respectively, there may also occur defective or missing contacting between the contact needles and the contact pads. Therefore, an optical inspection of the contact faces or contact pads at semiconductor devices is performed after the contacting of the contact pads by the contact needles to determine the actual position of the contact needles on the contact pads of the semiconductor device.

On the surface of the contact pads, the contact needles leave a trace in the form of an impression that occurs optically as a shading. By the optical inspection of the contact pads, the impression or the position of the contact needle during the contacting on the contact pad can be detected by means of this shading. If the detected position of the contact needle does not lie on the contact pad or not in the desired region on the contact pad, respectively, the position of the contact needles or of the probe card, respectively, of the test device may, in a subsequent adjustment step, be corrected correspondingly vis-à-vis the contact pad of the semiconductor device to be tested.

By means of the hitherto used prior art test systems and tools for the optical inspection it is, however, only possible to analyze impressions of contact needles on contact pads with relatively simple contact pad geometries (e.g., in the form of a rectangle, a rectangle with beveled corners or round contact pads). Any modification of the contact pad geometry and any modification of the surface structure of the contact pads require an adaptation of the software algorithms of the image recognition.

Furthermore, the impressions of the contact needles on the contact pads of semiconductor devices with modified chip design such as it is, for instance, used with current semiconductor memory chips with the highest treatises, cannot be judged meaningfully with the existing methods and test systems. Due to modifications of the layers positioned below the contact pad, modifications of its surface may occur. Consequently, by means of conventional image recognition systems, the center of the contact pad which appears somewhat darker vis-à-vis the surrounding region cannot be differentiated from the impression of the contact needle, this resulting in that the position of the impression of the contact needle is determined incorrectly. In such cases the size of the impression of the contact needles on the contact pad cannot be interpreted correctly since, e.g., a too large region is interpreted as an impression of the contact needle. Moreover, the distance to the edge of the contact pad may be determined incorrectly.

With known methods, for every new contact pad design that could not be analyzed with existing algorithms, the analysis system hitherto had to be programmed with a new algorithm. The procedure of the new programming of the analysis system is, however, time consuming and cost intensive. Moreover, all the hitherto used algorithms are based on the principle of identifying the impression of the contact tips on the contact pads of the semiconductor device by means of the modified contrast of the optical appearance, which is only possible with difficulty in the case of a poor contrast and leads to unreliable results.

For these and other reasons, there is a need for the present invention.

SUMMARY

The present invention provides a system and method for optical inspection. In one embodiment, a reference image is initially taken of a contact pad that has not yet been contacted by a contact needle. This reference image is subtracted from the image to be analyzed, and the image resulting from this subtraction or taking of a difference, respectively, is analyzed by means of a suitable algorithm to determine at which position the contact needle has left an impression on the contact pad, i.e., at which position the contact needle has contacted the contact pad.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a schematic representation of the optical appearance of the impression of a contact needle (probe) on a modified contact pad, and the way it is interpreted in accordance with a one embodiment of the method according to the present invention.

DETAILED DESCRIPTION

Figure 1:
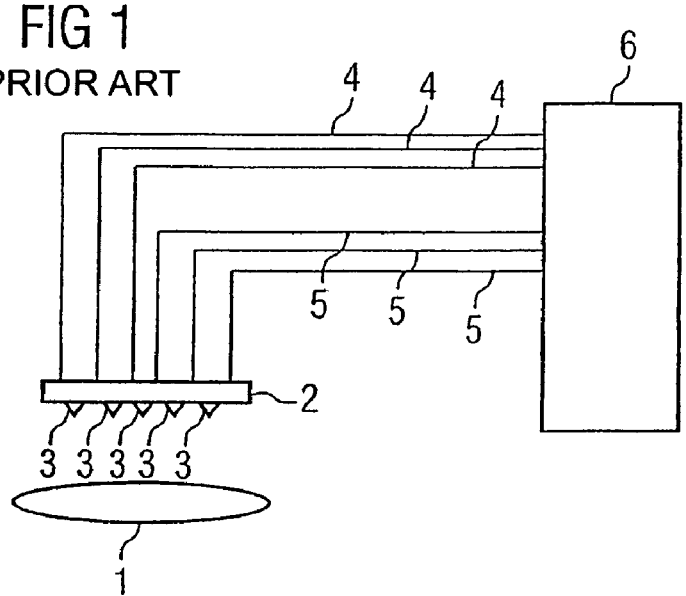
FIG. 1 illustrates a schematic representation of the basic structure of a prior art semiconductor device test system used for the testing of semiconductor devices positioned on a wafer, comprising a test device and a probe card with contact needles (probes) arranged thereon.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method that is capable of determining the position of the contact needle tips on the contact pad in a reliable and simple manner irrespective of the contact pad geometry and the character of the contact pad surface.

In one embodiment, the present invention provides a method for the optical inspection of contact faces at semiconductor devices. In one embodiment, the present invention provides a system for the optical inspection of contact faces at semiconductor devices.

In one embodiment, the present invention provides a method for the optical inspection of contact faces or contact pads, respectively, at semiconductor devices which are contactable by means of contact elements of a test system for testing the operability of the semiconductor device. The method includes optical recognition of the surface of the contact pad prior to the contacting of the contact pad by a contact element for generating a first image.

Optical recognition of the surface of the contact pad is performed after the contacting of the contact pad by a contact element for generating a second image.

A difference between the reference image and the image to be analyzed is taken for generating a third image. The third image is analyzed for recognizing impressions or contrasts left by the contact element on the contact pad during contacting.

One advantage of the present invention consequently consists in that, by means of the taking of a difference between a reference image prior to a contacting of the contact pad and the image to be analyzed after the contacting of the contact pad, virtually any contact pad geometry and contact pad surface can be analyzed. This effect is based on the fact that the respective characteristics of the contact pad geometry and shadings on the contact pad surface are subtracted out by the taking of a difference between the reference image and the image to be analyzed. By the comparison of the image to be analyzed with the reference image, the required image information for determining the position of the contact needles on the contact pads is extracted. The result image occurring due to the taking of a difference is thus absent of optical irritations that might impair the analysis.

After the evaluation of the result image, the positions of the contact needles or of the probe card, respectively, of the test device may, if necessary, be corrected vis-à-vis the contact pads of the semiconductor device to be tested so as to establish a reliable electrical connection between the test device and the semiconductor device to be tested. The reliable contacting may ensure that the transmission of the signals between the semiconductor device to be tested and the test device is performed as exactly as possible, with the respectively desired voltage intensities and/or the desired chronological sequence, etc. Another advantage of the present invention consists in that the method is adapted to autonomously react quickly and flexibly to any possible modification in the optical appearance of the contact pads and to provide a meaningful analysis.

The taking of a difference between the reference image and the image to be analyzed may either be performed by subtracting the reference image from the image to be analyzed, or, vice versa, by subtracting the image to be analyzed from the reference image. It is particularly advantageous if the difference is calculated between respectively corresponding image points of the reference image and the image to be analyzed. In so doing, the taking of a difference between the reference image and the image to be analyzed may be based on the shades of gray of the image points or the shadings or contrasts, respectively, left by the contact element on the contact pad during contacting.

Advantageously, the reference image is stored in the test system at least for the period from its recognition to the taking of a difference between the reference image and the image to be analyzed. Likewise, the image to be analyzed may be stored in the test system at least from its recognition to the taking of a difference between the reference image and the image to be analyzed.

In accordance with one embodiment of the inventive method, the optical recognition of the surface of the contact pad for generating the reference image or the image to be analyzed is performed in the way of an optical exposure by analog and/or digital exposure means such as e.g. appropriate cameras. Depending on the character of the surface and the structure of the contact pad, the optical recognition of the appearance of the surface of the contact pad can be performed in the visible range, in the ultraviolet and/or in the infrared spectral range. Since semiconductor devices usually comprise a major number of contact pads, it is of advantage if the optical inspection of the contact faces or contact pads, respectively, of a number of contact pads of one or a plurality of semiconductor devices is performed simultaneously.

In another embodiment of the inventive method it is determined, on the basis of the analysis of the result image, whether the impression left by the contact element on the contact pad lies within the contact pad or within a predetermined region on the contact pad. If this determination results in that the impression left by the contact element on the contact pad does not lie within the contact pad or not within a predetermined region on the contact pad, a corresponding correction of the position of the contact elements relative to the contact pads may be initiated, so that the position of the contact needle on the contact pad lies within the contact pad or within a predetermined region on the contact pad during the next contacting.

For correcting the position of the contact elements relative to the contact pads, a calibration process that serves to calibrate the test system is particularly suited. This way, the usual process for testing the semiconductor device is virtually not impaired.

In accordance with another embodiment of the present invention, the above-mentioned object is solved by a system for the optical inspection of contact faces or contact pads, respectively, at semiconductor devices which is adapted to perform the above-described method according to the present invention, wherein the system comprises at least one contact element for contacting the contact pads and a device by means of which the position of the contact elements can be varied relative to the contact pads, and wherein the system correspondingly corrects the position of the contact elements relative to the contact pads by means of the device if the impression left by the contact element on the contact pad does not lie within the contact pad or within a predetermined region on the contact pad. The correction of the position of the contact elements relative to the contact pads may either be performed by a corresponding change of the position of the contact elements and/or by a change of the position of the contact pads.

In one embodiment, the inventive system is designed such that the contact pads of the semiconductor devices to be tested are contactable by the contact elements of the system while the semiconductor devices are still positioned on a wafer or in a clamp or carrier. Thus, the tests for examining the operability of the semiconductor devices can be performed at wafer level already when the semiconductor devices are still positioned on the wafer, or at a later time of the manufacturing process.

In accordance with another embodiment, the inventive system comprises electronic calculating means that are adapted to perform the taking of a difference between the reference image and the image to be analyzed so as to generate a result image. Furthermore, the system may comprise electronic storage means that are adapted to store the reference image, the image to be analyzed and/or the result image.

FIG. 1 illustrates the basic structure of a test system or a test station, respectively, according to prior art for testing the operability of semiconductor devices. The test system comprises an electronic control device 6 that is connected with a semiconductor device test card or probe card 2 via electric lines 4 and 5. In the test station illustrated in FIG. 1, the semiconductor devices to be tested are, in the semi-finished state, still positioned on a monocrystalline silicon disc, the so-called wafer 1.

The semiconductor devices that are still positioned on the wafer 1 may, for instance, be integrated (analog or digital) computing circuits and/or semiconductor memory devices such as functional memory devices (PLAs, PALs, etc.,) or table memory devices (e.g., ROMs or RAMS), in particular SRAMs or DRAMs (Static or Dynamic Random Access Memories or static or dynamic read-write memories, respectively) with single or double data rate (DDR-DRAMs=Double Data Rate-DRAMs).

For testing the semiconductor devices, a test device 6 (e.g., a digital ATE test device with DC function) generates test signals that are transmitted to a semiconductor device test card or probe card 2 via one or a plurality of corresponding signal lines (driver channels) 4. Contact needles 3 that electrically contact the corresponding contact pads on the semiconductor device to be tested are arranged at the probe card 2. The test signals are transmitted by the test device 6 via the probe card 2 and the contact needles 3 positioned at the bottom thereof to the corresponding connections or contact pads on the semiconductor device and thus introduced into the semiconductor device.

The signals output at the corresponding semiconductor device connections or contact pads in reaction to the test signals input are in turn tapped by contact needles 3 of the probe card 2 and supplied to the test device 6 via the above-mentioned or one or a plurality of further signal line(s) 5, where an evaluation of the signals received may take place.

Figure 2A:
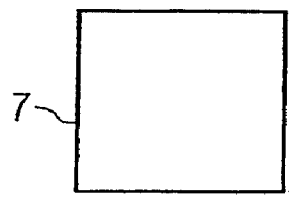
FIGS. 2A, 2B, and 2C illustrate a schematic representation of the optical appearance without or with the impression of a contact needle on a normal contact pad, and the way it is interpreted by a semiconductor device test system according to prior art.
Figure 2B:
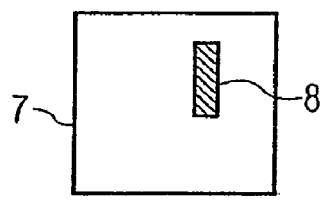
Figure 2C:
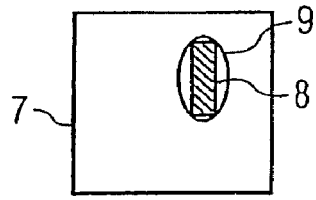

FIGS. 2A, 2B, and 2C each illustrate a schematic representation of the optical appearance without or with the impression of a contact needle (probe) 3 on a normal contact pad, and the way it is interpreted by an analysis system according to prior art. FIG. 2A illustrates a schematic representation of a common contact pad 7 with a normal geometry and a homogeneous appearance without the impression of a contact needle 3. FIGS. 2B and 2C each show the same contact pad 7 of FIG. 2A after having been contacted by a contact needle 3 that has left an impression 8. The impression 8 of the contact needle 3 on the contact pad 7 is characterized in FIGS. 2B and 2C by a darker-shadowed or hatched rectangular field.

In FIG. 2C there is indicated by means of an ellipse 9 how a presently used analysis or image recognition system according to prior art would interpret the impression 8 of the contact needle 3 on the normal contact pad 7. It is revealed that the impression 8 of the contact needle 3 lies within the ellipse 9, wherein the ellipse 9 calculated by the analysis system touches all the corners of the impression 8. Accordingly, the analysis system according to prior art has in this case been capable of achieving, due to the homogeneous appearance of the contact pad 7, a correct localization of the impression 8 of the contact needle 3 and thus of correctly recognizing the position of the contact needle 3 on the contact pad 7 during the contacting.

Figure 3A:
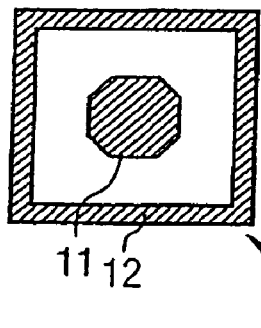
FIGS. 3A, 3B, and 3C illustrate a schematic representation of the optical appearance without or with the impression of a contact needle on a modified contact pad, and the way it is interpreted by a semiconductor device test system according to prior art.
Figure 3B:
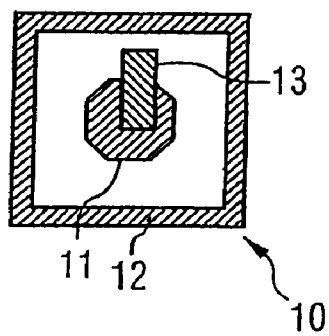
Figure 3C:
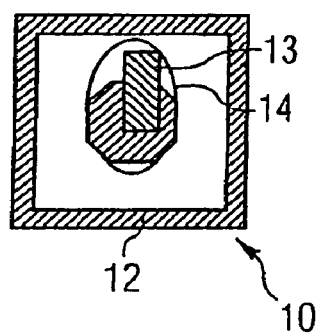

FIGS. 3A, 3B, and 3C illustrate a schematic representation of the optical appearance without or with the impression of a contact needle 3 on a modified contact pad 10, and the way it is interpreted by an analysis system according to prior art. In this modified contact pad 10, modifications in the optical appearance of the surface exist due to modifications of material layers positioned below the contact pad 10. These modifications in the optical appearance of the surface of the contact pad 10 are indicated in FIGS. 3A, 3B, and 3C by differently strong shadings or hatchings 11, 12 in the center and at the edge of the contact pad 10.

FIG. 3A illustrates a schematic representation of the modified contact pad 10 with a modified geometry and an inhomogeneous appearance without the impression of a contact needle 3. FIGS. 3B and 3C each illustrate the same contact pad 10 of FIG. 3A after having been contacted by a contact needle 3 and that has left an impression 13. The impression 13 of the contact needle 3 on the contact pad 10 is characterized in FIGS. 3B and 3C by a dark shadowed or hatched rectangular field.

FIG. 3C illustrates by means of an ellipse 14 how a presently used analysis or image recognition system according to prior art would interpret the impression 13 of the contact needle 3 on the modified contact pad 10. The automatic inspection of a prior art analysis system cannot differentiate the center 11 of the contact pad 10 which appears somewhat darker vis-à-vis the surrounding region from the impression 13 of the contact needle 3. As is illustrated in FIG. 3C, the ellipse 14 calculated by the analysis system covers both the impression 13 of the contact needle 3 and the center 11 of the contact pad which appears somewhat darker vis-à-vis the surrounding region. Thus, the conventional image recognition system interprets the center 11 of the contact pad 10 which appears dark also as an impression of the contact needle 3, so that the position of the impression of the contact needle 3 on the modified contact pad 10 is determined incorrectly.

FIG. 4 schematically illustrates the procedure of the taking of a difference according to the inventive method. FIG. 4 schematically illustrates three images of a modified contact pad 10 with or without the impression 13 of a contact needle 3, and the way they are processed in accordance with a preferred embodiment of the method according to the present invention.

At the left side of FIG. 4, there is schematically illustrated the image A of the surface of a modified contact pad 10 with an inhomogeneous appearance, after having been contacted by a contact needle 3 and thus comprises an impression 13 of a contact needle 3. The appearance A illustrated at the left side of FIG. 4 consequently corresponds to the appearance illustrated in FIG. 3B. In the middle of FIG. 4, there is schematically illustrated the reference image R of the same contact pad 10 as at the left side of FIG. 4, before having been contacted by a contact needle 3 and consequently not comprising any impression 13 of a contact needle 3. The reference image R schematically illustrated in the middle of FIG. 4 consequently corresponds to the appearance illustrated in FIG. 3A. The mathematic function symbols "−" and "=" in FIG. 4 constitute the operations that are performed in accordance with the inventive method by means of the appearances of the surface of the contact pad 10, which will be described in more detail in the following.

In accordance with the inventive method, a first optical recognition of the surface of the contact pad 10 is performed before its having been contacted by a contact element or a contact needle 3, respectively, this resulting in the generation of a reference image R that is illustrated in the middle of FIG. 4. After the contact pad 10 has been contacted by a contact needle 3, a second optical recognition of the surface of the contact pad 10 is performed to generate an image to be analyzed A, which is illustrated at the left side of FIG. 4. Subsequently, according to the inventive method there ensues the taking of a difference between the reference image R and the image to be analyzed A, which is indicated by the subtraction symbol between the left image (image to be analyzed A) and the middle image (reference image R) in FIG. 4.

The result of this taking of a difference is a result image E that is illustrated at the right side of FIG. 4. It reveals that the correspondences between the image to be analyzed A and the reference image R have been subtracted out in the result image E by the taking of a difference. Thus, the regions of the edge 12 and the center 11 of the contact pad 10 which appear darker are no longer present in the result image E at the right side of FIG. 4. The irritations on the surface of the contact pad 10 which are, for instance, caused by a modified geometry or the layer construction of the contact pad 10 and which might impair the analysis of the result image have thus been eliminated in the optical result image E.

From the difference between the image to be analyzed A and the reference image R there is in the result image E only left the impression 13 that has been left on the contact pad 10 during contacting by the contact element or the contact needle 3, respectively. In a further step of the inventive method, the result image E is analyzed, and the position of the contact needle 3 on the contact pad 10 during contacting can unambiguously be determined by means of the impression 13.

Before or during the subtraction of the reference image R from the image to be analyzed A, the information about the position of the pad edge 12 is also recognized and stored since it is no longer present in the result image E after the taking of a difference. This information is used to determine the distance of the impression 13 to the pad edge 12. Due to the good contrast between the surface of the contact pad 10 and the surrounding passivation, the determination of the pad edge 12 is possible without any problems. Deviations in the optical appearance of the contact pads 10, e.g., a modified contrast due to a modified roughness of the contact pad 10, which appear by process fluctuations, may also be compensated with the method according to the present invention.

If, on the basis of the analysis, a deviation in the position of the contact needle 3 from the region of the contact pad 10 or from a predetermined region of the contact pad 10 is detected, an adjustment step for correcting the position of the contact needles 3 vis-à-vis the contact pads 10 may be performed. By means of FIG. 1 it becomes comprehensible that, for performing the adjustment step in which the position of the contact needles 3 vis-à-vis the contact pads 10 is corrected, the wafer 1 may first be moved away from the bottom of the probe card 2 for performing the optical inspection and, after the analysis has been performed, may be moved back again, taking into account the adjustment or correction, respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for optical inspection of contact faces or contact pads, respectively, of semiconductor devices which are contactable by means of contact elements of a test system for testing operability of a semiconductor device, comprising:
    optical recognition of a surface of a contact pad prior to contacting the contact pad by a contact element for generating a reference image;
    optical recognition of the surface of the contact pad after contacting the contact pad by the contact element for generating an image to be analyzed;
    taking a difference between the reference image and the image to be analyzed for generating a result image; and
    analyzing the result image for recognizing contrasts or impressions left by the contact element on the contact pad during contacting.

2. The method according to claim 1, wherein the taking of a difference between the reference image and the image to be analyzed is performed by subtracting the reference image from the image to be analyzed, or by subtracting the image to be analyzed from the reference image.

3. The method according to claim 1, wherein the taking of a difference between the reference image and the image to be analyzed is performed by the taking of a difference between corresponding image points of the reference image and of the image to be analyzed.

4. The method according to claim 1, wherein the taking of a difference between the reference image and the image to be analyzed is performed by the taking of a difference between the shades of gray of the image to be analyzed and the shades of gray of the reference image.

5. The method according to claim 1, wherein the analyzing of the result image is performed by means of an algorithm that detects in particular shadings or contrasts left by the contact element on the contact pad during contacting.

6. The method according to claim 1, wherein the reference image is stored in the test system at least from its recognition to the taking of a difference between the reference image and the image to be analyzed.

7. The method according to claim 1, wherein the image to be analyzed is stored in the test system at least from its recognition to the taking of a difference between the reference image and the image to be analyzed.

8. The method according to claim 1, wherein the optical recognition of the surface of the contact pad for generating the reference image or the image to be analyzed is performed in the way of an optical exposure by analog and/or digital exposure means.

9. The method according to claim 1, wherein the optical recognition of the appearance of the surface of the contact pad is performed in the visible range, in the ultraviolet and/or the infrared spectral range.

10. The method according to claim 1, wherein the optical inspection of contact faces or contact pads is preformed simultaneously for a number of contact pads of one or a plurality of semiconductor devices.

11. The method according to claim 1, wherein, before or during the taking of a difference between the reference image and the image to be analyzed, the position of the edge of the contact pad is recognized and preferably stored so as to determine the distance of the impression to the edge of the contact pad.

12. The method according claim 1, wherein the method further comprises:
    determining, on the basis of the analysis of the result image, whether the impression left by the contact element on the contact pad lies within the contact pad or within a predetermined region on the contact pad.

13. The method according to claim 12, wherein the method further comprises:
    initiating a corresponding correction of the position of the contact elements relative to the contact pads if the impression left by the contact element on the contact pad does not lie within the contact pad or not within the predetermined region on the contact pad.

14. The method according to claim 13, wherein the correction of the position of the contact elements relative to the contact pads is performed in a calibration process serving to calibrate the test system.

15. A method for optical inspection of contact faces or contact pads, respectively, of semiconductor devices which are contactable by means of contact elements of a test system for testing operability of a semiconductor device, comprising:
    optical recognition of a surface of a contact pad prior to contacting the contact pad by a contact element for generating a reference image;

optical recognition of the surface of the contact pad after contacting the contact pad by a contact element for generating an image to be analyzed;

taking a difference between the reference image and the image to be analyzed for generating a result image;

analyzing the result image for recognizing contrasts or impressions left by the contact element on the contact pad during contacting; and wherein the taking a difference between the reference image and the image to be analyzed is performed by subtracting the reference image from the image to be analyzed, or by subtracting the image to be analyzed from the reference image, and taking a difference between corresponding image points of the reference image, and taking a difference between shades of gray of the image to be analyzed and shades of gray of the reference image.

16. The method according to claim 15, wherein analyzing the result image is performed by means of an algorithm that detects in particular shadings or contrasts left by the contact element on the contact pad during contacting.

17. The method according to claim 16, wherein the reference image is stored in the test system at least from its recognition to the taking of a difference between the reference image and the image to be analyzed; and wherein the image to be analyzed is stored in the test system at least from its recognition to the taking of a difference between the reference image and the image to be analyzed.

18. The method according to claim 17, wherein the optical recognition of the surface of the contact pad for generating the reference image or the image to be analyzed is performed in the way of an optical exposure by analog and/or digital exposure means; and wherein the optical recognition of the appearance of the surface of the contact pad is performed in the visible range, in the ultraviolet and/or the infrared spectral range.

19. The method according to claim 18, wherein the optical inspection of contact faces or contact pads is performed simultaneously for a number of contact pads of one or a plurality of semiconductor devices; and wherein, before or during the taking of a difference between the reference image and the image to be analyzed, the position of the edge of the contact pad is recognized and preferably stored so as to determine the distance of the impression to the edge of the contact pad.

20. The method according to claim 19, wherein the method further comprises:

determining, on the basis of the analysis of the result image, whether the impression left by the contact element on the contact pad lies within the contact pad or within a predetermined region on the contact pad; and initiating a corresponding correction of the position of the contact elements relative to the contact pads if the impression left by the contact element on the contact pad does not lie within the contact pad or not within the predetermined region on the contact pad; and wherein the correction of the position of the contact elements relative to the contact pads is performed in a calibration process serving to calibrate the test system.

21. A system for optical inspection of contact faces or contact pads, respectively, of semiconductor devices which are contactable by means of contact elements of a test system for testing operability of a semiconductor device, comprising:

means for optical recognition of a surface of a contact pad prior to contacting the contact pad with a contact element for generating a reference image;

means for optical recognition of the surface of the contact pad after contacting the contact pad with the contact element for generating an image to be analyzed;

means for taking a difference between the reference image and the image to be analyzed for generating a result image; and means for analyzing the result image for recognizing contrasts or impressions left by the contact element on the contact pad during contacting.

22. An apparatus for optical inspection of contact faces or contact pads of semiconductor devices, comprising:

an optical recognition device for optical recognition of a surface of a contact face/pad prior to and after contacting the contact face/pad with a contact element for generating a reference image and an image to be analyzed respectively, and an analyzer for analyzing the difference between the reference image and the image to be analyzed for recognizing contrasts or impressions left by the contact element on the contact face during contact by the contact element.

* * * * *